(12) United States Patent
Strickland et al.

(10) Patent No.: US 12,093,003 B2
(45) Date of Patent: Sep. 17, 2024

(54) UNIVERSAL BAY CHASSIS AND SYSTEM FOR SELF-IDENTIFICATION AND AUTOMATIC CONFIGURATION OF AN INFORMATION HANDLING SYSTEM IN THE CHASSIS

(71) Applicant: Dell Products L.P., Round Rock, TX (US)

(72) Inventors: Stephen Strickland, Foxborough, MA (US); Jeffrey Michael Lewis, Maynard, MA (US); Kevin Warren Mundt, Austin, TX (US); Shawn Joel Dube, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 739 days.

(21) Appl. No.: 17/243,217

(22) Filed: Apr. 28, 2021

(65) Prior Publication Data

US 2022/0350298 A1 Nov. 3, 2022

(51) Int. Cl.
*G05B 19/042* (2006.01)
*H05K 7/14* (2006.01)

(52) U.S. Cl.
CPC ......... *G05B 19/042* (2013.01); *H05K 7/1489* (2013.01); *G05B 2219/25257* (2013.01)

(58) Field of Classification Search
CPC ........ G05B 19/042; G05B 2219/25257; H05K 7/1489; H05K 7/1487
USPC .............................................................. 700/2
See application file for complete search history.

(56) References Cited

U.S. PATENT DOCUMENTS

2021/0208555 A1* 7/2021 Palanivel ............. G05B 19/042
2022/0330450 A1* 10/2022 Dillon .................. H05K 7/1492

* cited by examiner

*Primary Examiner* — Michael J Brown
(74) *Attorney, Agent, or Firm* — McDermott Will & Emery LLP

(57) ABSTRACT

A build on-demand chassis with a universal bay system that can be assembled into different configurations to support different system requirements from end users includes positionable partitions and a bay support assembly for each set of devices. A controller communicates with a microcontroller unit (MCU) in each bay support assembly to determine a slot identifier and a type of device supported by the bay support assembly to provide greater flexibility in what configurations are possible. When a processor in the information handling system sends an instruction for a type of device, the controller knows the location and capabilities of the device and manages the communication.

15 Claims, 8 Drawing Sheets

UNIVERSAL BAY CHASSIS AND SYSTEM FOR SELF-IDENTIFICATION AND AUTOMATIC CONFIGURATION OF AN INFORMATION HANDLING SYSTEM IN THE CHASSIS

BACKGROUND

Field of the Disclosure

This disclosure relates generally to information handling systems and, more particularly, to a chassis for supporting multiple sets of devices of an information handling system and a method for automatic configuration of the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems for use as servers and data centers are typically assembled in chassis or other enclosures specifically manufactured for that information handling system.

SUMMARY

Embodiments disclosed herein may be generally directed to a universal bay chassis configurable to contain multiple devices of an information handling systems and a system for self-identification and automatic configuration of an information handling system in the chassis when the information system is powered up.

Embodiments may be directed to a universal bay system and method for assembling a universal bay system for accommodating multiple sets of devices of an information handling system in a chassis. A universal bay system may comprise a pair of guide rails, a plurality of support planes connected to the pair of guide rails, and a plurality of partitions. A first support plane and an adjacent second support plane may be separated by a distance to form a row. Each partition comprises a first wall comprising a first wall connector and a support plane connector and a second wall comprising a second wall connector and a second support plane connector. The second wall connector engages the first wall connector to form the partition. Each partition is coupled to the first support plane and the second support plane to divide the row into a plurality of bays.

In some embodiments, a wall for a particular bay may be assembled with a device retainer configured to retain of a set of devices in the bay. The device retainer may comprise a plurality of device rails to allow a technician to slide a set of memory devices, processing devices, storage devices or networking devices into the bay.

A bay support assembly for the chassis comprises a set of slots for electrically and communicatively coupling to each device of the set of devices installed in the bay. A controller may be configured to execute a set of instructions to communicate with a microcontroller unit (MCU) in each bay support assembly to determine the type of bay support assembly and a device connection identifier for each device connection of a plurality of device connections. The controller may be a baseboard management controller (BMC). The controller may be configured to communicate with a device based on a communication protocol associated with the type of bay support assembly and the device connection.

In some embodiments, positioning a plurality of partitions relative to the first support plane to form a plurality of bays comprises assembling a first wall and a second wall, wherein each wall comprises device retainers.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
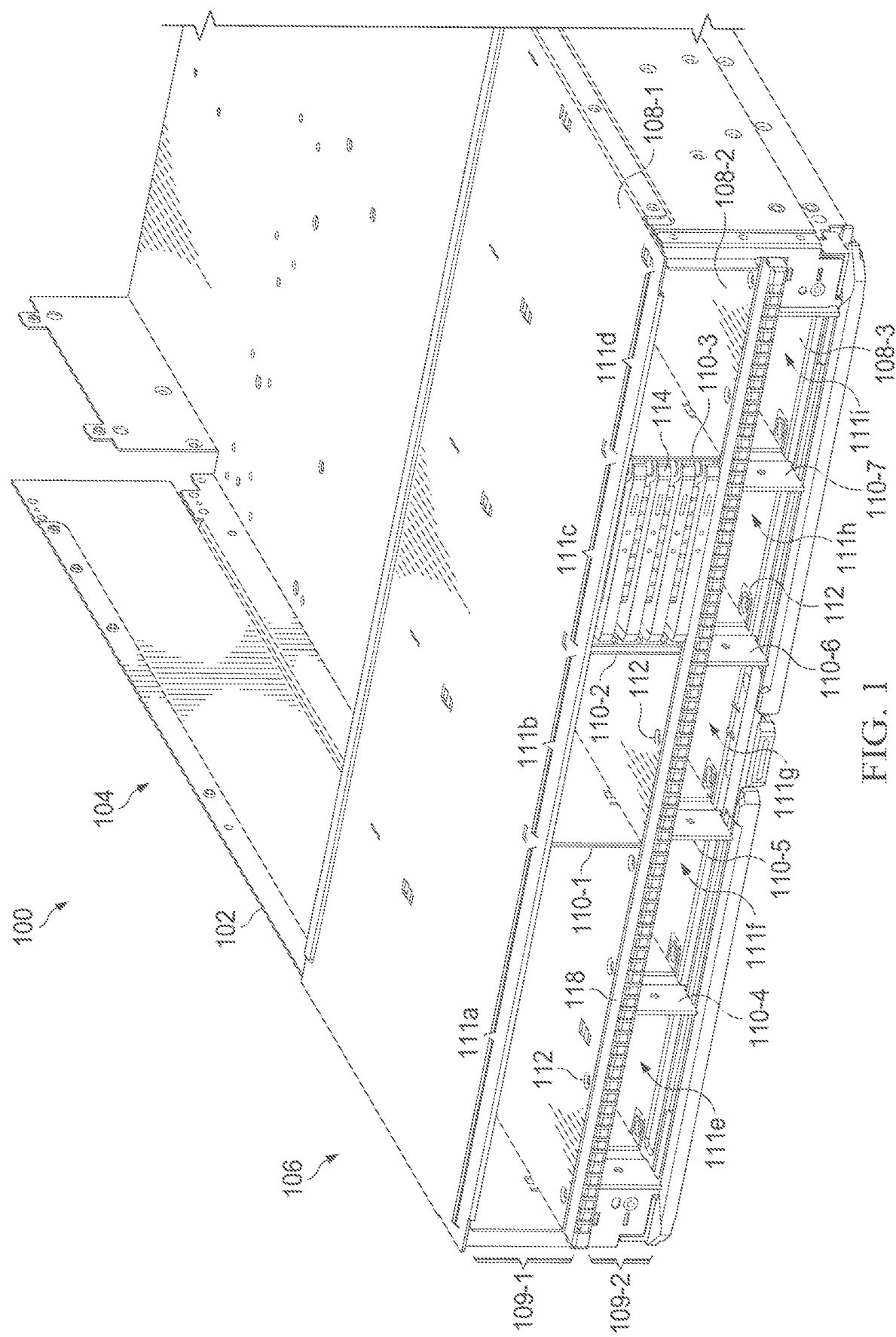
FIG. 1 is a perspective view of an embodiment of a universal bay configurable to accommodate variations in an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, device "114-1" refers to an instance of a device, which may be referred to collectively as devices "114" and any one of which may be referred to generically as device "114."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Typically, information handling systems such as servers and storage arrays support a set of standard configurations of devices in the front and rear of the chassis. Often, the front only contain SFF-8639 (also referred to as U.2 drive) devices. These information handling systems have several deficiencies. For example, end users have an increasing number of different system requirements such that a limited set of possible configurations may not include a configuration capable of holding the appropriate set of devices for an end user. Also, processors, memory devices, I/O storage devices, networking devices and other components in each device are increasing in power, such that a new device may require more fresh air options for inactive or active airflow to meet system thermal requirements.

Many devices may be field replaceable units (FRUs) configured with common connectors. However, replacement of a device may result in the need to reconfigure communication protocols an information handling system and information handling systems are expected to handle newer high speed buses. Manually reconfiguring an information handling system when a FRU is replaced may be expensive and time consuming.

To address these concerns and others, embodiments disclosed herein include a universal bay system for a chassis that is customizable to accommodate devices with different form factors, provide required airflow and meet other end user requirements without requiring a platform-specific chassis. The chassis provides a common bay framework to maximize the number of different types of devices and form factors. A bay support assembly supports self-identification and automatic configuration of the information handling system when the information handling system is powered up and is capable of communicating over high speed buses.

Embodiments disclosed herein are described with respect to an information handling system installed in a chassis having two guide rails and an accessible front portion and a back portion and a universal bay system that accommodates different sets of devices. Particular embodiments are best understood by reference to FIGS. 1-5, 6A-6B and 7A-7B, wherein like numbers are used to indicate like and corresponding parts.

Turning to the drawings, FIG. 1 is a perspective view of a chassis with an embodiment of a universal bay system configurable to accommodate multiple sets of devices of an information handling system in various arrangements in the chassis.

Chassis 100 may be manufactured with two guide rails 102 to allow chassis 100 to be inserted or withdrawn from a server rack or other structure (not shown). Rear portion 104 may accommodate cabling, fans and other components for managing the performance of processing, storage, memory and network devices in chassis 100. Front portion 106 may comprise a universal bay system that is configurable to retain sets of devices in various arrangements for improved cooling or performance of information handling system.

As depicted in FIG. 1, embodiments of a universal bay system may include at least two support planes 108 coupled to each guide rail 102, wherein first support plane 108-1 and second support plane 108-2 are separated by a distance to form a first row 109-1 and second support plane 108-2 and third support plane 108-3 are separated by a distance to form a second row 109-2.

Embodiments of a universal bay system may further include a plurality of partitions 110 coupled to two adjacent support planes (e.g., support planes 108-1 and 108-2) to divide row 109 into bays 111. For example, partitions 110-1, 110-2, 110-3 and 110-4 divide row 109-1 into bays 111a, 111b, 111c, 111d and 111e and partitions 110-5, 110-6, 110-7 and 110-8 divide row 109-2 into bays 111f, 111g, 111h, 111j and 111k.

Each partition 110 is configured to couple to receivers 112 in each support plane 108 to divide rows 109 into bays 111. Receivers 112 may be recessed openings or slots formed in support planes 108. Each bay 111 may be configured to retain a set of devices 114 such as shown in bay 111c.

Figure 2:
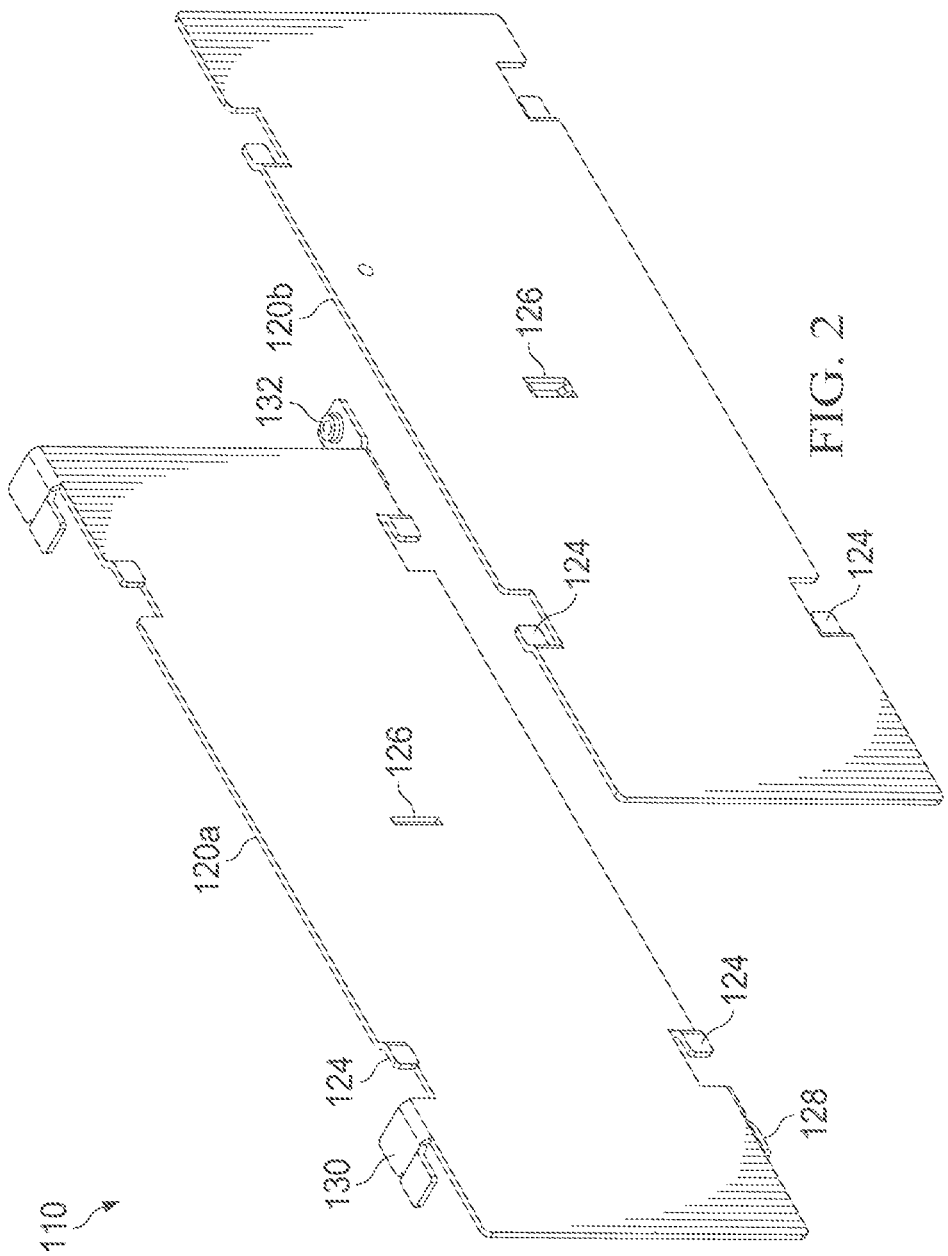
FIG. 2 is a perspective view of one embodiment of two walls that can interconnect to form a partition between adjacent bays in the universal bay depicted in FIG. 1.

Referring to FIG. 2, each partition 110 may comprise two walls 120, wherein each wall 120 comprises interconnecting features 124 for interconnecting first wall 120a to second wall 120b and locking feature 126 for securely engaging first wall 120a and second wall 120b. Base locking feature 128 may engage partition 110 with a first support plane 108 and top locking feature 130 may engage partition 110 with a second support plane 108. In some embodiments, base locking feature 128 or top locking feature 130 may comprise a tab for inserting and sliding into a receiver 112 and attachment hardware 132 may prevent partition 110 from sliding back out.

Figure 3:
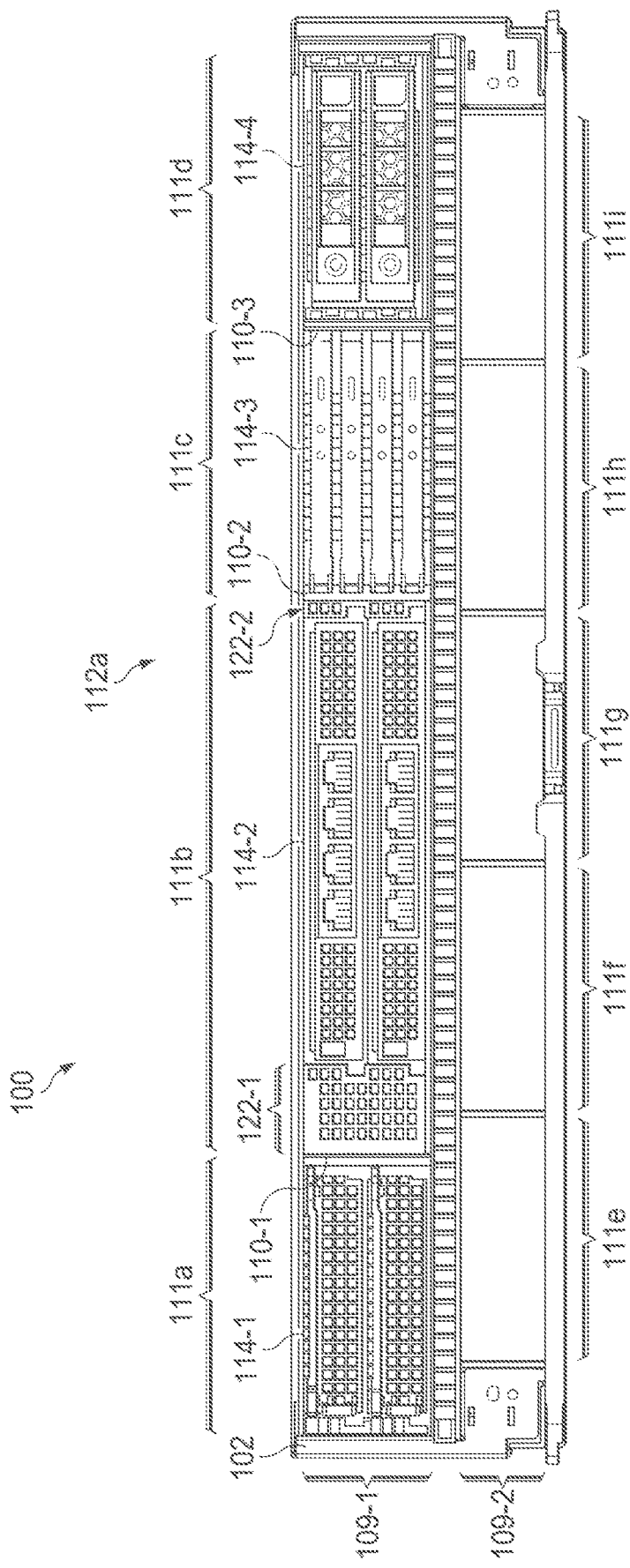
FIG. 3 is a perspective view of the universal bay depicted in FIG. 1 with two partitions, each partition comprising two interconnected walls.

Referring to FIG. 3, each partition 110 separates two adjacent bays 111. In some embodiments, each bay 111 may be defined by two walls 120 that face each other and are configured to retain selected devices 114. The distance between two adjacent partitions 110 and the device retainers 134 coupled to walls 120 may be configured to accommodate power supply units (PSU)s, I/O storage devices 114, and memory devices 114 of different form factors, with different airflow requirements and power supply requirements and ambient noise restrictions.

During manufacture of chassis 100, each pair of walls 120a, 120b may be connected to form partitions 110. Furthermore, walls 120 associated with a bay 111 may be configured to retain a set of devices 114. For example, as depicted in FIG. 3, first wall 120a and second wall 120b associated with bay 111c may be configured with device rails 118 to allow a technician to install, service or remove devices 114 in chassis 100.

Embodiments may therefore be configured using partitions 110 to divide rows 109 into bays 111 and each bay 111 is defined by two walls 120 that can be configured to retain a specific set of devices 114. For example, bay 111*a* may be sized to retain a set of large form factor (LFF) devices 114 or a set of small form factor (SFF) devices 114 and provide a channel for airflow.

Referring to FIG. 3, when assembled, chassis 100 with a universal bay system may be configured for accommodating a plurality of devices 114 in a configuration that allows cooling of the one or more devices 114. For example, a first set of devices 114-1 or second set of devices 114-2 may require higher airflow for cooling. Second bay 108*b* may be configured with an open region 122 to allow more airflow past first set of devices 114-1 or second set of devices 114-2. FIG. 3 depicts row 109-1 having four bays 111*a*, 111*b*, 111*c* and 111*d* with each bay 111 configured for a particular set of devices 114.

SELF-IDENTIFICATION AND AUTOMATIC CONFIGURATION WHEN POWERED UP

Figure 4:
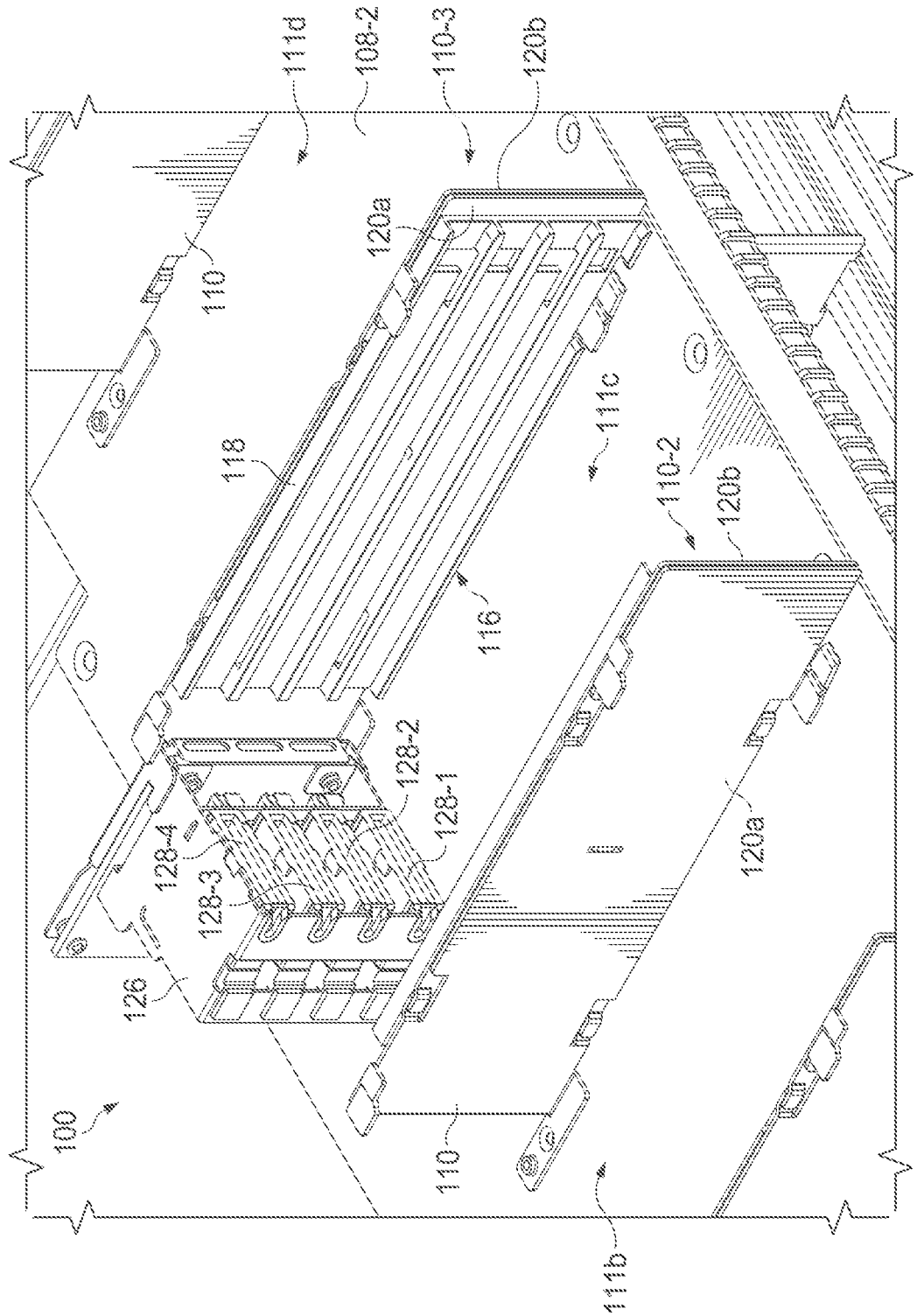
FIG. 4 is a front view of the universal bay depicted in FIG. 1 configured with multiple partitions to accommodate multiple devices of varying form factors.

Referring to FIG. 4, each bay 111 may comprise a bay support assembly 126, wherein each bay support assembly 126 comprises a plurality of device connections 128, wherein each device connection 128 is configured for electrical and communicative coupling of bay support assembly 126 to one or more devices 114 in a bay 111.

Bay support assembly 126 comprises a microcontroller unit (MCU) that knows what board it is connected to and therefore knows what devices can be supported in bay 111. For example, strapping pins used in the assembly of a midplane board may be arranged to configure the midplane board. The MCU may be used to manage and control side band signals. In some embodiments, the MCU may control out of band resets and power. For example, if an issue is identified with a device, the host can send a command to the MCU to reset the specific device to bring it back online. The MCU may also store location information for a device. Slot location may include a location within a bay as well as a location within the bay. If bays 111 are cabled, cable location identifier allows the BMC to identify which host port is connected to which bay. Thus, embodiments allow for mapping of the system connection topology. Embodiments may further allow for LED control. For example, different modules may have different LED functions and the MCU may control these LEDs to remove complexities from the BMC.

When an information handling system is powered up, a controller such as a BMC may communicate with each MCU to capture information about what types of devices the MCU can support. For example, a BMC may communicate with a MCU and determine the MCU can support OCP cards and further determine that the MCU is coupled to Port 4 corresponding to bay 5.

The BMC can send this information to a processor wanting to communicate with an OCP card or can receive communications from a processor and route the communication to the appropriate port (e.g., Port 4).

Embodiments allow greater awareness of the configuration of an information handling system. For example, embodiments may assist in identifying problems with particular device connections 128 or devices 114 in a device connection 128.

In some embodiments, a processor associated with a graphical user interface (GUI) may communicate with BMC to pull information about devices 114 in chassis 100 and determine which bay and which device connection the bay contain what type of device. In some embodiments, a processor may inventory an information handling system in chassis 100 and determine that an I/O card is not in a preferred device connection based on information received from the BMC.

Figure 5:
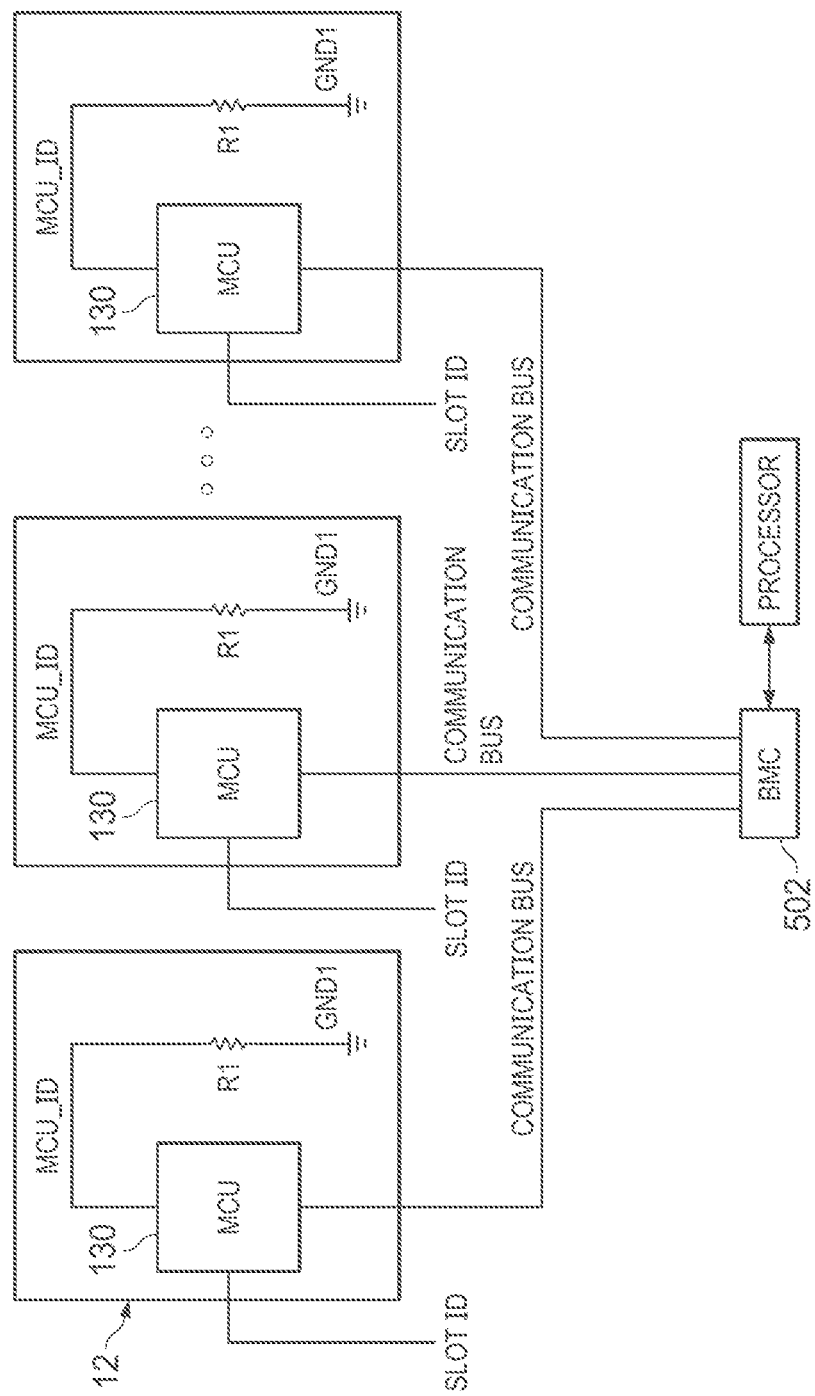
FIG. 5 is a bay diagram, illustrating a system for configuring an information handling system with a plurality of devices and communicating with the devices.

FIG. 5 is a bay diagram of selected components and devices of an information handling system that may be installed in chassis 100 using a universal bay system as described above.

Each bay support assembly 126 comprises a microcontroller unit (MCU) coupled to each device connection 128 in bay support assembly 126.

Each MCU 162 may be communicatively coupled to a baseboard management controller (BMC) 120. When information handling system is powered on, BMC 120 may automatically communicate with each bay support assembly 126 to determine an MCU_ID 163 and a SLOT_ID.

MCU_ID 163 defines the type of bay support assembly 126. For example, MCU_ID 163-1 may define the type of bay support assembly 126-1 as being coupled to a set of storage devices 114-1, MCU_ID 163-2 may define the type of bay support assembly 126-2 as being coupled to a set of large form function (LFF) memory devices 114-2 and MCU_ID 163-3 may define the type of bay support assembly 126-3 as being coupled to a set of processing devices 114-3. In some embodiments, MCU_ID comprises strapping pins (not shown) that define the type of devices supported by bay support assembly 126.

SLOT_ID defines the location of a bay support assembly 126. For example, SLOT_ID may define the location of a bay support assembly 126 that corresponds to Port 1. Embodiments may associate Port 1 with bay 111*c* in row 109-1. In some embodiments, SLOT_ID comprises strapping pins (not shown) that define the location of a bay support assembly 126. In some embodiments, each bay 111 in chassis 100 has a keyed tab that is in a unique location to the bay's column. In these embodiments, installation of device(s) 114 will ground to the keyed tab to identify which column the device(s) 114 is positioned. Other variations that allow for self-identification of devices 114 and automatic configuration of an information handling system in chassis 100 may be possible.

Self-identification of what devices 114 are installed in chassis 100 and automatic configuration of BMC 120 allows newer devices 114 to replace legacy devices 114 and avoids the need for a technician to manually reconfigure the information handling.

BMC 120 may store the MCU_ID and SLOT_ID information for the information handling system as configured in memory. During operation of information handling system 180, BMC 120 may ensure any communication to a device 114 is routed to the correct bay 111 and device connection 128. For example, BMC 120 may ensure any communication from processor 182 to a storage device is routed to a specific bay 111, including routed to a device connection 128, wherein any communication to the storage device is communicated according to a communication protocol associated with the type of bay support assembly 126 or device connections 128.

Figure 6A:
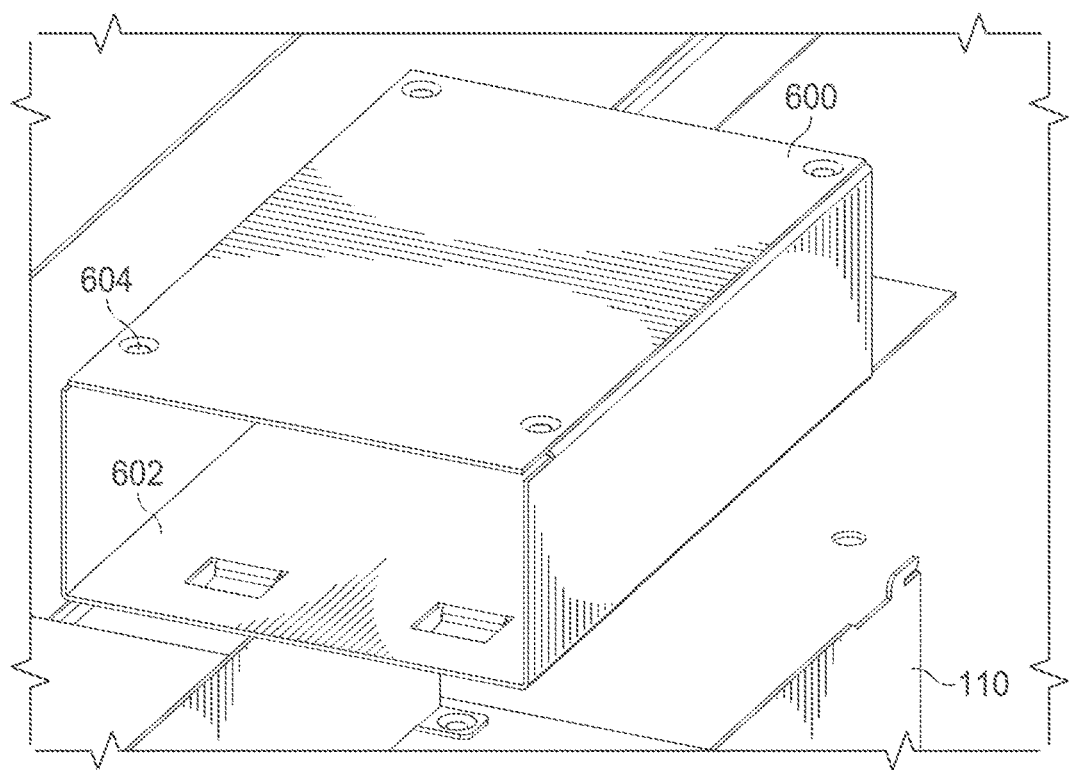
FIGS. 6A-6B depict partial perspective views of a chassis with one embodiment of a canister, illustrating a method for installing the canister in a bay.
Figure 6B:
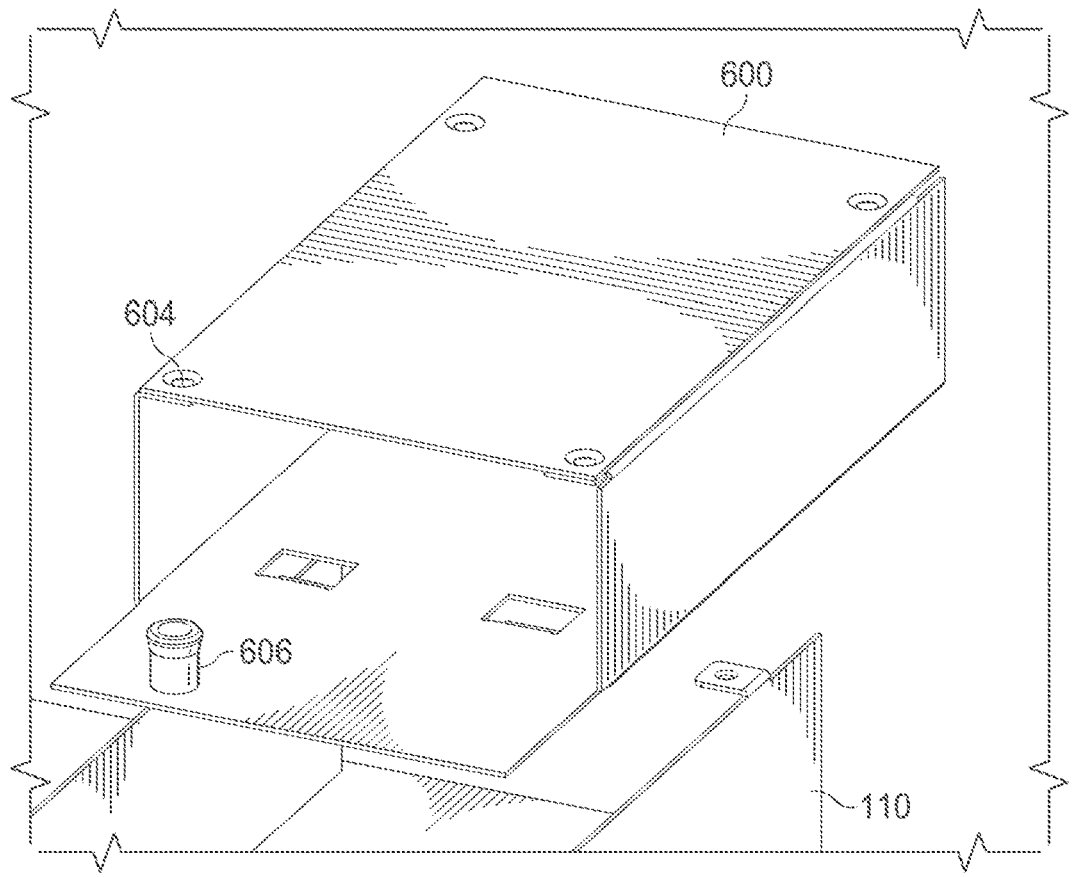

FIGS. 6A-6B depict partial perspective views of a chassis with one embodiment of a universal bay system comprising canister 600 for positioning between adjacent dividers 110 in a bay 111. As depicted in FIG. 6A, canister 600 may be positioned relative to bay 111 such that hooks 602 are generally aligned with openings (not visible in FIG. 6A) on support plane 108. As depicted in FIG. 6B, canister 600 may be translated relative to support plane 108 to engage hooks 602 in the openings to couple canister 600 to support plane 108. In some embodiments, additional hardware 606 may prevent canister 600 from translating relative to support plane 108. For example, hardware 606 may be a screw, bolt or other hardware requiring a tool to install. As depicted in FIG. 6B, some embodiments may use spring-loaded hardware 606 such that, when canister 600 is positioned in bay 111, hardware 606 may automatically engage support plane 108 to prevent translation of canister 600 but may be disengaged by a user manually withdrawing hardware 606 from support plane 108.

Figure 7A:
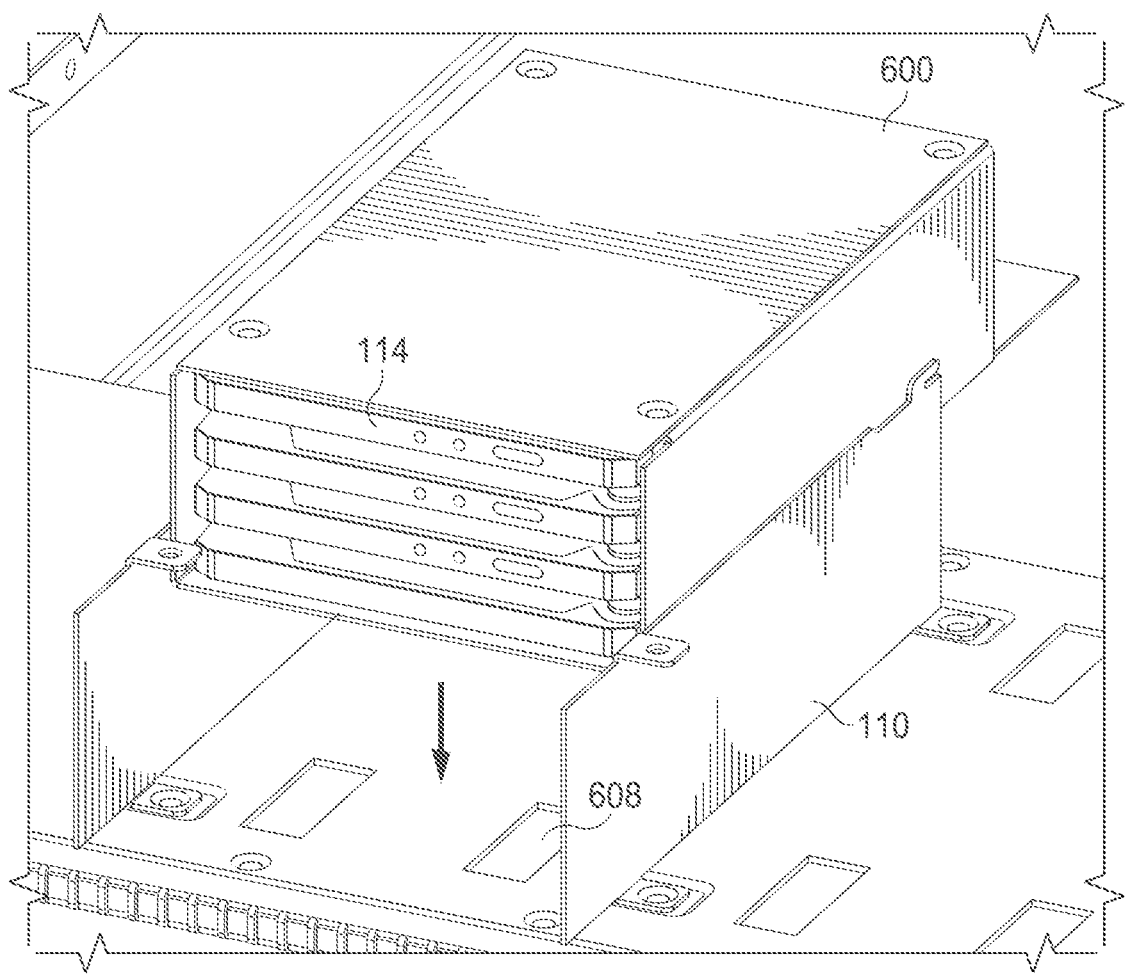
FIGS. 7A-7B depict partial perspective views of a chassis with one embodiment of a canister containing multiple devices, illustrating a method for assembling an information handling system.
Figure 7B:
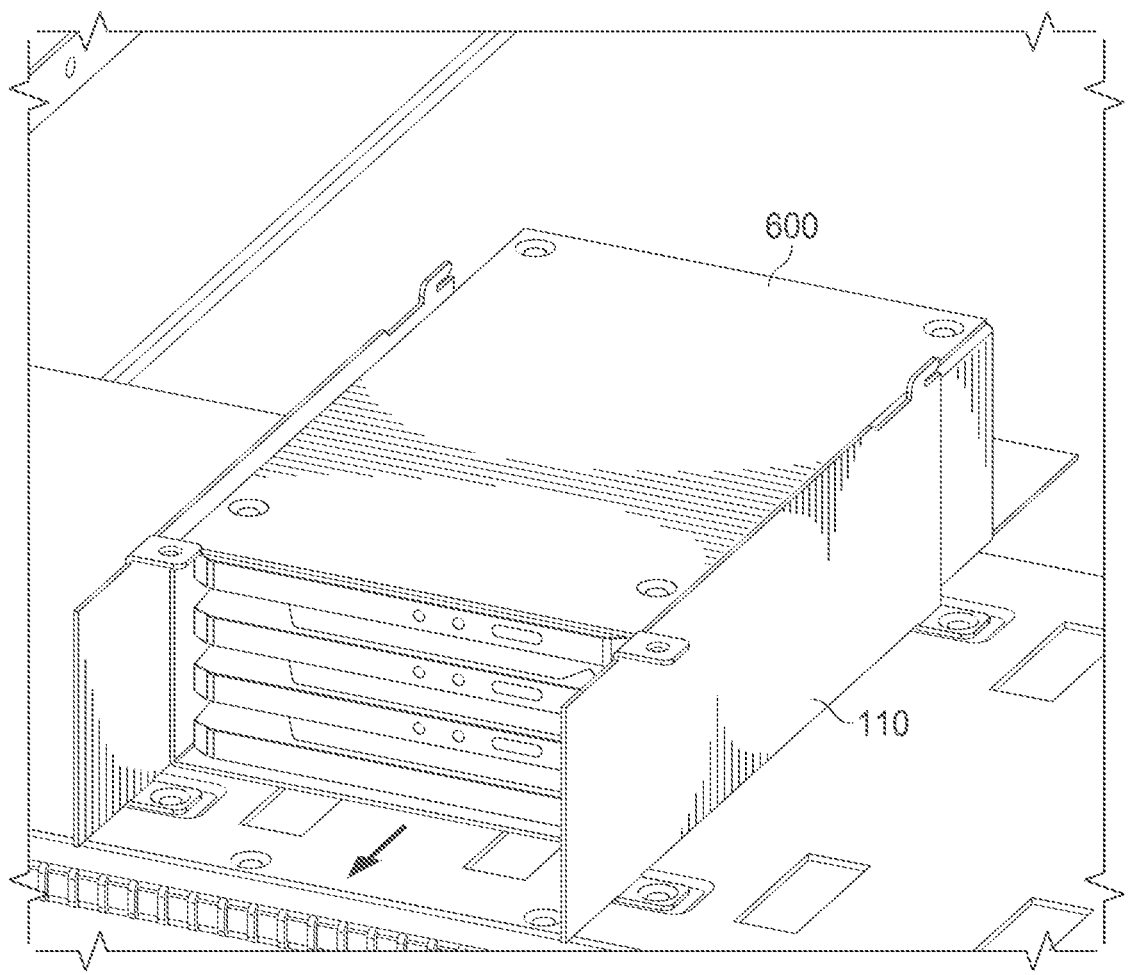

FIGS. 7A and 7B depict partial perspective views of a chassis with one embodiment of a canister 600 having multiple devices 114 installed therein. As depicted in FIG. 7A, canister 600 may contain a set of devices 114. Canister 600 may be positioned between partitions 110 if bay 111 such that hooks 602 (not visible in FIG. 7A) are aligned with openings 608 in support plane 108. As depicted in FIG. 7B, canister 600 may be translated to engage hooks 602 in openings 608 to couple canister 600 to support plane 108 as part of an assembly process of chassis 100.

Embodiments disclosed herein are described in relation to bays 111 forming part of a front portion 106 of chassis 100. However, embodiments may also be implemented in relation to bays forming part of back portion 104 of chassis 100.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A chassis comprising:
a pair of guide rails;
a first support plane coupled to each guide rail of the pair of guide rails;
a second support plane coupled to each guide rail of the pair of guide rails and separated from the first support plane to form a row;
a plurality of partitions for positioning between and connecting to the first support plane and the second support plane, wherein
each partition comprises a first wall engaged with a second wall, and
a first wall of a first partition of the plurality of partitions and a second wall of a second partition of the plurality of partitions have device retainers for retaining a set of devices;
wherein the first support plane, the second support plane, and the partitions define a plurality of bays, wherein each bay of the plurality of bays includes a keyed tab that identifies a location of the bay with respect to the chassis,
a bay support assembly comprising:
a set of device connections for electrically and communicatively coupling to each device of the set of devices; and
a controller configured to execute a set of instructions to:
communicate with a microcontroller unit (MCU) of the bay support assembly when the information handling system is powered up to determine a type of bay support assembly, a device connection identifier for each device connection of a plurality of device connections, and a location of the bay support assembly with respect to the chassis based on installation of the set of devices establishing a connection with that the keyed tab of the bay the set of devices are located in.

2. The chassis of claim 1, wherein the controller comprises a baseboard management controller (BMC).

3. The chassis of claim 2, wherein the controller is configured to communicate with the device based on a communication protocol associated with the type of bay support assembly.

4. The chassis of claim 3, wherein the set of devices comprises one of a set of processors, memory devices, I/O storage devices and network devices.

5. The chassis of claim 4, wherein the device retainers comprise device rails for installing and removing the set of devices.

6. A universal bay system for retaining an information handling system in a chassis, the universal bay system comprising:
a pair of guide rails;
a first support plane coupled to each guide rail of the pair of guide rails;
a second support plane coupled to each guide rail of the pair of guide rails and separated from the first support plane to form a row;
a plurality of partitions for positioning between and connecting to the first support plane and the second support plane, wherein
each partition comprises a first wall engaged with a second wall, and
a first wall of a first partition of the plurality of partitions and a second wall of a second partition of the plurality of partitions have device retainers for retaining a set of devices;
wherein the first support plane, the second support plane, and the partitions define a plurality of bays, wherein each bay of the plurality of bays includes a keyed tab that identifies a location of the bay with respect to the chassis,
a bay support assembly comprising:
a set of device connections for electrically and communicatively coupling to each device of the set of devices; and
a controller configured to execute a set of instructions to:
communicate with a microcontroller unit (MCU) of the bay support assembly when the information handling system is powered up to determine a type of bay support assembly, a device connection identifier for each device connection of a plurality of device connections, and a location of the bay support assembly with respect to the chassis based on installation of the set of devices establishing a connection with the keyed tab of the bay that the set of devices are located in.

7. The universal bay system of claim 6, wherein the controller comprises a baseboard management controller (BMC).

8. The universal bay system of claim 7, wherein the controller is configured to communicate with the device based on a communication protocol associated with the type of bay support assembly.

9. The universal bay system of claim 8, wherein the set of devices comprises one of a set of processors or a set of memory devices.

10. The universal bay system of claim 9, wherein the device retainers comprise rails for installing and removing the set of devices.

11. A method for configuring an information handling system in a chassis, the method comprising:
- connecting a first support plane to a first guide rail and a second guide rail;
- connecting a second support plane to the first guide rail and the second guide rail;
- positioning a plurality of partitions between the first support plane and the second support plane to define a plurality of bays, wherein each bay of the plurality of bays includes a keyed tab that identifies a location of the bay with respect to the chassis;
- positioning a bay support assembly relative to a bay of the plurality of bays;
- positioning a set of devices in the bay; and
- connecting the set of devices to a set of device connections in the bay support assembly,
- wherein a controller communicatively coupled to the bay support assembly is configured for:
  - communicating with a microcontroller unit (MCU) in the bay support assembly when the information handling system is powered up to determine i) a device connection identifier for each device connection in the bay support assembly, ii) determine a type of bay support assembly, and iii) a location of the bay support assembly with respect to the chassis based on installation of the set of devices establishing a connection with the keyed tab of the bay that the set of devices are located in; and
  - determining a communication protocol for each device in the set of devices in the bay based on the type of bay support assembly and the device connection identifier for the device connection.

12. The method of claim 11, wherein the controller comprises a baseboard management controller (BMC).

13. The method of claim 12, wherein the controller is configured for routing communication to a set of devices based on a communication protocol associated with the type of bay support assembly.

14. The method of claim 11, wherein positioning a plurality of partitions relative to the first support plane to form a plurality of bays comprises assembling a first wall and a second wall, wherein each wall comprises device retainers.

15. The method of claim 14, wherein each wall comprises device rails for installing and removing the set of devices.

* * * * *